United States Patent
Wang et al.

(10) Patent No.: US 10,074,731 B2
(45) Date of Patent: Sep. 11, 2018

(54) METHOD FOR FORMING SEMICONDUCTOR DEVICE STRUCTURE

(71) Applicant: Taiwan Semiconductor Manufacturing Co., Ltd., Hsinchu (TW)

(72) Inventors: Shih-Wei Wang, Hsinchu (TW); Chia-Hao Chang, Hsinchu (TW); Wen-Cheng Luo, Taoyuan (TW)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 0 days.

(21) Appl. No.: 15/062,787

(22) Filed: Mar. 7, 2016

(65) Prior Publication Data

US 2017/0256627 A1    Sep. 7, 2017

(51) Int. Cl.
*H01L 29/66* (2006.01)
*H01L 21/3205* (2006.01)
*H01L 21/768* (2006.01)
*H01L 21/308* (2006.01)

(52) U.S. Cl.
CPC .... *H01L 29/66795* (2013.01); *H01L 21/3081* (2013.01); *H01L 21/32053* (2013.01); *H01L 21/76865* (2013.01); *H01L 21/76874* (2013.01); *H01L 21/76876* (2013.01)

(58) Field of Classification Search
CPC ............. H01L 29/665; H01L 21/76874; H01L 21/76876; H01L 21/76875; H01L 21/32053; H01L 29/66795

IPC ........................................ H01L 21/3205,29/665
See application file for complete search history.

(56) References Cited

U.S. PATENT DOCUMENTS

| | | | | |
|---|---|---|---|---|
| 6,406,994 | B1* | 6/2002 | Ang | B41M 5/5254 438/622 |
| 6,534,389 | B1* | 3/2003 | Ference | H01L 21/76897 257/E21.507 |
| 8,253,230 | B2* | 8/2012 | Janzen | H01L 21/76898 257/501 |
| 8,293,603 | B2* | 10/2012 | Cho | H01L 21/768 257/E21.41 |
| 8,859,386 | B2* | 10/2014 | Lu | H01L 28/24 257/350 |
| 8,993,432 | B2* | 3/2015 | Hou | H01L 22/14 257/E21.597 |
| 9,184,060 | B1* | 11/2015 | Lee | H01L 21/31144 |
| 9,337,083 | B2* | 5/2016 | Shieh | H01L 21/76895 |
| 9,559,002 | B2* | 1/2017 | Lee | H01L 23/5226 |
| 9,793,204 | B2* | 10/2017 | Lin | H01L 23/5226 |
| 2009/0102025 | A1* | 4/2009 | Hayashi | H01L 21/28061 257/632 |

(Continued)

*Primary Examiner* — Savitr Mulpuri
(74) *Attorney, Agent, or Firm* — Birch, Stewart, Kolasch & Birch, LLP

(57) ABSTRACT

A method for forming a semiconductor device structure is provided. The method includes forming a target layer over a substrate and forming a seed layer over the target layer. The method includes forming a hard mask layer over the seed layer, and the hard mask layer includes an opening to expose a portion of the seed layer. The method includes forming a conductive layer in the opening, and the conductive layer is selectively formed on the portion of the seed layer. The method includes etching a portion of the target layer by using the conductive layer as a mask.

18 Claims, 17 Drawing Sheets

(56) References Cited

U.S. PATENT DOCUMENTS

2011/0210447 A1* 9/2011 Seidel ............... H01L 21/76808
257/774

* cited by examiner

METHOD FOR FORMING SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Semiconductor manufacturing technologies include a number of processes which involve complex physical and chemical interactions. The photolithography process is the process of transferring patterns of geometric shapes on a mask to a thin layer of photosensitive material (resist) covering the surface of a semiconductor wafer. The photolithography process is becoming a more sensitive and critical step in IC fabrication process as feature sizes shrink to ever-smaller sizes. However, there are many challenges related to the photolithography process.

Although existing photolithography process and methods of fabricating semiconductor device structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
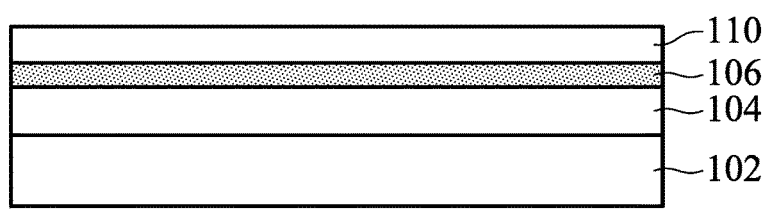
FIGS. 1A-1F show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1F show cross-sectional representations of various stages of forming a semiconductor device structure 100a, in accordance with some embodiments of the disclosure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A target layer 104 is formed over the substrate 102. The target layer 104 may be a dielectric layer, such as silicon oxide (SiOx), silicon nitride (SixNy), silicon oxynitride (SiON), dielectric material(s) with low dielectric constant (low-k), or combinations thereof. The target layer 104 will be patterned by the following operations. The target layer 104 may be a single layer or multiple layers.

The target layer 104 may be formed by a front-end-of-line (FEOL) process or back-end-of-line (BEOL) process. The target layer 104 may be formed by a deposition process, such as chemical vapor deposition process (CVD), physical vapor deposition process (PVD), spin-on coating process, sputtering process, planting process, or a combination thereof. The CVD process may be a low-pressure CVD (LPCVD) or plasma enhanced CVD (PECVD).

In some embodiments, device elements (not shown) are formed in the target layer 104. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 102 in a front-end-of-line (FEOL) process.

Afterwards, a seed layer 106 is formed over the target layer 104. The seed layer 106 is configured to facilitate the formation of a conductive layer 120 (shown in FIG. 1C). In some embodiments, the seed layer 106 is made of silicon (Si), titanium (Ti), titanium nitride (TiN), aluminum (Al), copper (Cu), silver (Ag), platinum (Pt), applicable materials or a combination thereof. In some embodiments, the seed layer 106 is formed by a deposition process, such as chemical vapor deposition process (CVD), physical vapor deposition process (PVD), electroplating, sputtering process, planting process, or a combination thereof.

Afterwards, a hard mask layer 110 is formed over the seed layer 106. The hard mask layer 110 may be a single layer or multiple layers. The hard mask layer 110 may be made of silicon oxide, silicon nitride, silicon oxynitride, or another applicable material.

Figure 1B:
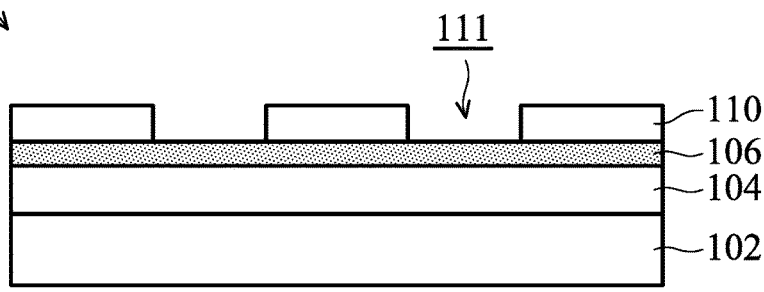

Afterwards, the hard mask layer 110 is patterned by a patterning process, as shown in FIG. 1B, in accordance with some embodiments of the disclosure. As a result, the patterned hard mask layer 110 includes openings 111. In addition, a portion of the top surface of the seed layer 106 is exposed.

The number of the openings 111 is not limited two (shown in FIG. 1B) and it is dependent on the actual application. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may be a wet etching process or a dry etching process.

Figure 1C:
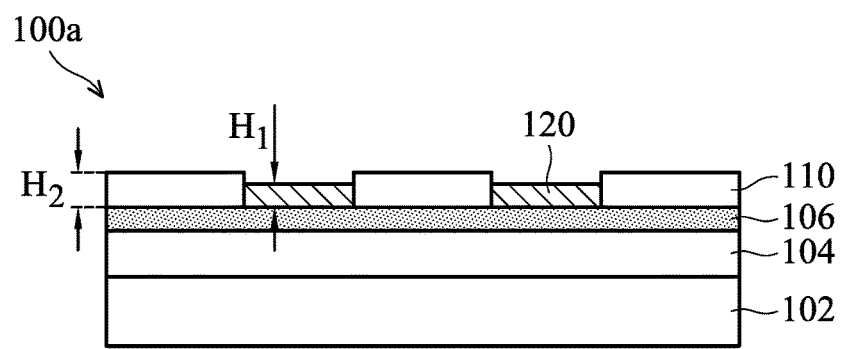

Afterwards, a conductive layer 120 is selectively formed in the openings 111, as shown in FIG. 1C, in accordance with some embodiments of the disclosure. The conductive layer 120 is only formed over the seed layer 106, but is not formed over the hard mask layer 110. In other words, the conductive layer 120 is directly formed on the exposed surface of the seed layer 106 and in direct contact with the seed layer 106.

The conductive layer 120 is formed by a selective deposition process. In some embodiments, the selective deposition process includes a selective chemical vapor deposition (CVD) process, an epitaxy process or a plating process. The advantage of the selective deposition process is that the conductive layer 120 is self-aligned formed on the seed layer 106, because the metal materials are attracted by the seed layer 106.

A second advantage of the selective deposition process is that no extra removing process is needed to remove excess metal materials. If the conductive layer 120 is formed by another deposition process, other than the selective deposition process, some metal materials may form over the hard mask layer 110. The excess metal materials should be removed by an additional removal operation, such as chemical mechanical polishing (CMP) process or no etching back process. In contrast to the normal deposition process, the conductive layer 120 is self-aligned and selectively formed on the seed layer 106. No excess metal materials are on the pattered hard mask layer 110, and therefore no additional removal operation is needed to remove the excess conductive layer. More specifically, in some embodiments, no chemical mechanical polishing (CMP) process or no etching back process is performed to remove the excess conductive layer. Since the removal operation (such as CMP process) is omitted, the fabrication process and cost are reduced.

In addition, if the conductive layer 120 is formed by another deposition process, other than the selective deposition process, some voids are formed in the conductive layer 120. The voids may degrade the performance of the conductive layer. Another advantage of the selective deposition process is that the conductive layer 120 is uniformly grown on the seed layer 106, the voids may be reduced. Therefore, the shape of the conductive layer 120 is better.

In some embodiments, the conductive layer 120 is made of metal or metal compound. The metal includes tungsten (W), aluminum (Al), copper (Cu), titanium (Ti), cobalt (Co), or applicable material. The metal compound includes metal silicide, metal nitride, metal oxide. In some embodiments, a selective chemical vapor deposition (CVD) process is performed to form the conductive layer 120 over the exposed surface of the seed layer 106. During the selective CVD process, an organometallic gas is introduced into a CVD chamber, the organometallic gas is thermally decomposed to form metal vapor and organic vapor. The metal vapor is spontaneously deposited and formed over the seed layer 106, and therefore the conductive layer 120 is selectively grown on the seed layer 106.

In some embodiments, the conductive layer 120 is made of high-melting point metal, such as tungsten (W). For example, the seed layer 106 is made of silicon (Si). A tungsten hexa-fluoride ($WF_6$) and is used as a precursor gas and the hydrogen ($H_2$) gas is used as a reduction gas during the selective CVD process, and. At the beginning, the chemical reaction is as following: $WF_6 + Si \rightarrow W + SiFx$ (g). In addition, another chemical reaction is occurred through adsorbed $H_2$ on existed W surface: $WF_6 + H_2 \rightarrow W + 6HF$ (g). Therefore, tungsten (W) layer keeps growing only on the seed layer 106 (made of conductive material), and is hardly deposited on the hard mask layer 110 (made of insulating material). The SiFx and HF are volatile and do not form on the seed layer 106. In some other embodiments, the conductive layer 120 is made of copper (Cu). For example, a Cu (hfac) TMVS (hfac: Hexafluoroacetylacetonate, TMVS: Trimethylvinylsilane) compound is used as a precursor. Cu (hfac) TMVS is in the liquid state at an ordinary temperature and an atmospheric pressure, and the CVD chamber is heated to vaporizes Cu(hfac) TMVS.

In some other embodiments, an electroless plating process is performed to form the conductive layer 120 over the exposed surface of the seed layer 106. In some embodiments, a platinum (Pt) layer is formed as a seed layer 106, and a copper conductive layer 120 is formed over the platinum seed layer 106 by electroless plating process. The copper conductive layer 120 is formed by using a copper containing solution, and the copper containing solution includes $CuSO_4 \cdot 5H_2O$.

In some embodiments, a pre-clean process is performed on the exposed surface of the seed layer 106 to clean the exposed surface.

The conductive layer 120 has a first height $H_1$ which is measured from the top surface of the seed layer 106 to the top surface of the conductive layer 120. The pattered hard mask layer 110 has a second height $H_2$ which is measured from the top surface of the seed layer 106 to the top surface of the pattered hard mask layer 110. In some embodiments, the first height $H_1$ is smaller than or equal to the second height $H_2$. In some embodiments, the top surface of the conductive layer 120 is level with or lower than a top surface of the patterned hard mask layer 110.

Figure 1D:
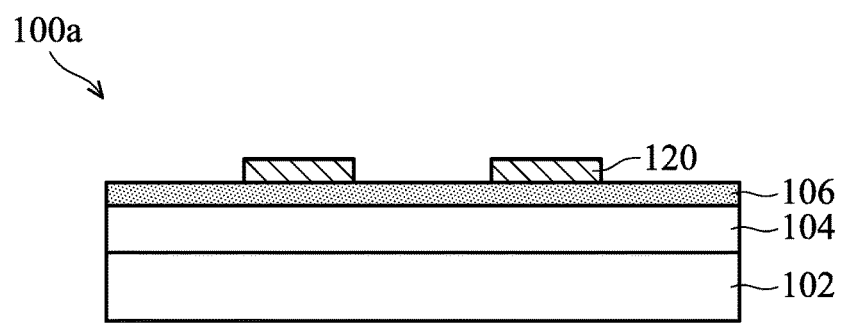

Afterwards, the pattered hard mask layer 110 is removed by a first etching process to expose a portion of the seed layer 106, as shown in FIG. 1D, in accordance with some embodiments of the disclosure. Because the conductive layer 120 has a highly etching selectivity in relation to the hard mask layer 110, the conductive layer 120 is not removed during the first etching process. In other words, the conductive layer 120 has a lower etching rate in relation to that of the hard mask layer 110.

The first etching process may be a dry etching process, a wet etching process or a combination thereof. In some embodiments, the first etching process is a dry etching process, the dry etching process includes an oxygen-containing gas, a fluorine-containing gas (e.g. $CF_4$, $SF_6$, $CH_2F_2$, $CHF_3$ and/or $C_2F_6$), a chlorine-containing gas (e.g. $Cl_2$, $CHCl_3$, $CCl_4$, and/or $BCl_3$), a bromine-containing gas (e.g. HBr and/or $CHBr_3$), another applicable gas, or a combination thereof. In some embodiments, the first etching process is a wet etching process, and the wet etching process includes an aqueous alkaline solution, an amine-solvent mixture, or an organic solvent.

Figure 1E:
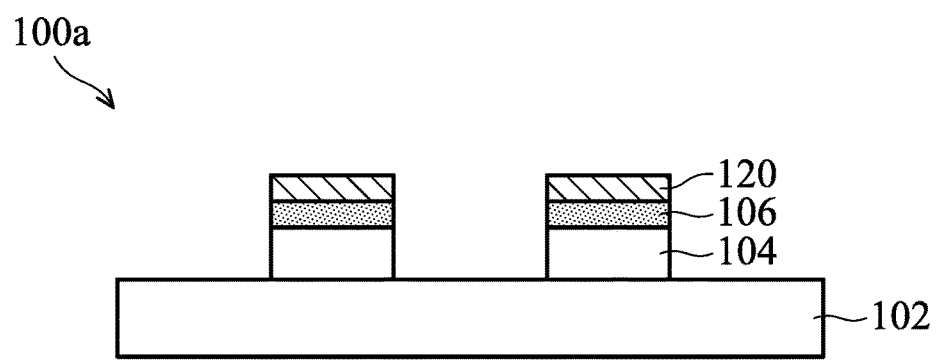

Afterwards, the exposed portion of the seed layer 106 and a portion of the target layer 104 are removed by using the conductive layer 120 as a mask, as shown in FIG. 1E, in accordance with some embodiments of the disclosure. In some embodiments, the exposed portion of the seed layer 106 is removed by a second etching process, and the portion of the target layer 104 is removed by a third etching process. The second etching process and the third etching process independently includes a dry etching process, a wet etching process or a combinations thereof.

The etching rate of the target layer 104 is faster than that of the conductive layer 120. As a result, the desirable pattern dimensions of the target layer 104 are well preserved. The pattern dimensions may be, for example, the distance of line end to line end, a critical dimension (CD) of the semiconductor device structure. Therefore, the embodiments of the disclosure provide a better performance in pattern transfer.

Figure 1F:
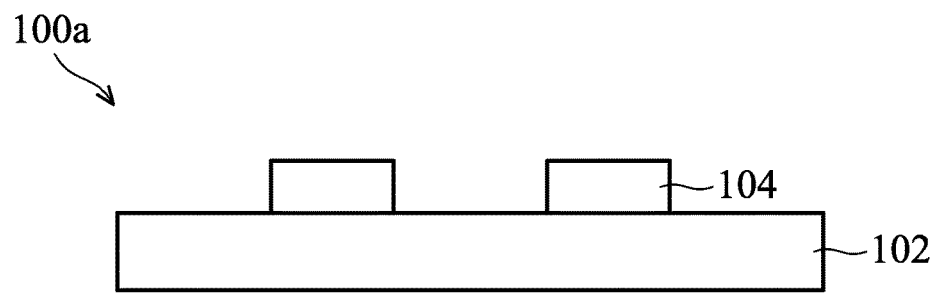

Afterwards, the conductive layer 120 and the seed layer 106 underlying the conductive layer 120 are removed, as shown in FIG. 1F, in accordance with some embodiments of the disclosure. As a result, the target layer 104 is patterned to have a desirable pattern. The conductive layer 120 and the seed layer 106 underlying the conductive layer 120 are removed by a multiple etching process.

FIGS. 2A-2G show cross-sectional representations of various stages of forming a semiconductor device structure 100b, in accordance with some embodiments of the disclosure. The semiconductor device structure 100b is similar to, or the same as, the semiconductor device structure 100a shown in FIG. 1F, except that a gate structure 210 is formed in the target layer 104. Processes and materials used to form the semiconductor device structure 100b may be similar to, or the same as, those used to form the semiconductor device structure 100a and are not repeated herein.

Figure 2A:
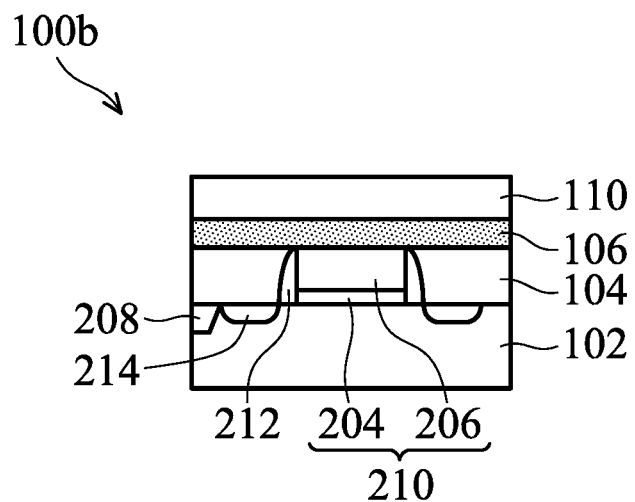
FIGS. 2A-2G show cross-sectional representations of various stages of forming a semiconductor device structure, in accordance with some embodiments of the disclosure.

As shown in FIG. 2A, the target layer 104 is formed over the substrate 102, and the gate structure 210 is formed in the target layer 104. In some embodiments, the target layer 104 is a dielectric layer, such as an inter-layer dielectric (ILD) layer. Afterwards, the seed layer 106 and the hard mask layer 110 are sequentially formed over the target layer 104. The gate structure 210 includes a gate dielectric layer 204 and a gate electrode layer 206 over the gate dielectric layer 204. The spacers 212 are formed on opposite sidewalls of the gate structure 210. The source/drain (S/D) structures 214 are formed in the substrate 102 and adjacent to the gate structure 210.

An isolation structure 208, such as shallow trench isolation (STI) feature or local oxidation of silicon (LOCOS) feature is formed in the substrate 102. The isolation structure 208 may define and isolate various device elements.

Figure 2B:
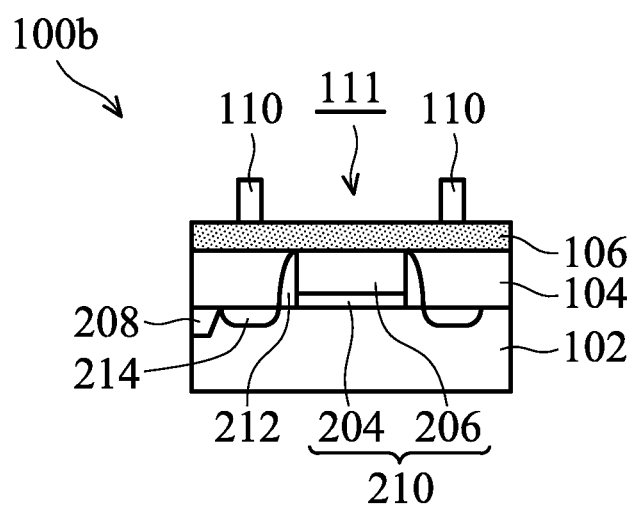

Afterwards, the hard mask layer 110 is patterned to expose a portion of the seed layer 106, as shown in FIG. 2B, in accordance with some embodiments of the disclosure. Therefore, the openings 111 are formed in the patterned hard mask layer 110.

Figure 2C:
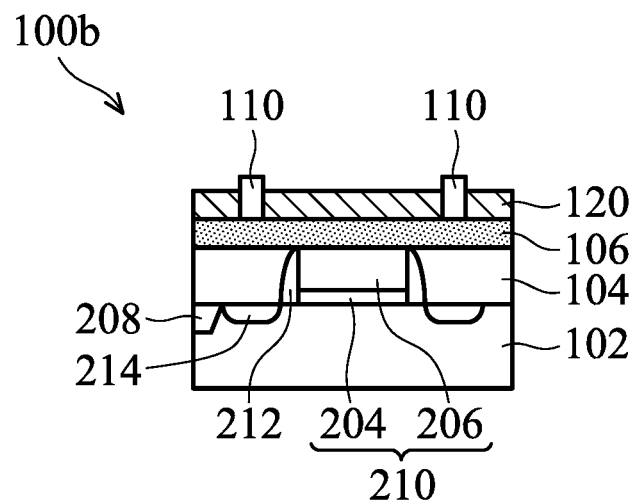

Afterwards, the conductive layer 120 is formed in the openings 111, as shown in FIG. 2C, in accordance with some embodiments of the disclosure. The conductive layer 120 is formed over the seed layer 106. More specifically, the conductive layer 120 is formed directly on the exposed seed layer 106. In some embodiments, the top surface of the conductive layer 120 is leveled with or lower than the top surface of the patterned hard mask layer 110.

In some embodiments, the conductive layer 120 is formed by a selective deposition process, such as selective CVD process or selective electroless plating process. In some embodiments, the conductive layer 120 is deposited only on a selected surface of the seed layer 106 by the selective CVD process, but is not formed over the hard mask layer 110.

Since the conductive layer 120 is not formed over the hard mask layer 110, no additional removal operation is needed to remove the excess of the conductive layer 120. Therefore, no CMP process or etching-back process is performed between the etching operation for removing the hard mask layer 110 and the deposition operation for forming the conductive layer 120. Therefore, the fabrication process is easy, and time and cost of the fabrication method are reduced.

Figure 2D:
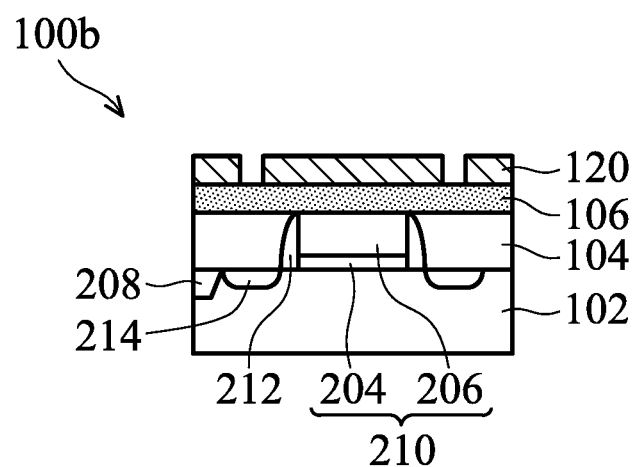

Afterwards, the patterned hard mask layer 110 is removed, as shown in FIG. 2D, in accordance with some embodiments of the disclosure. The conductive layer 120 has a high etching selectivity in relation to the hard mask layer 110, and therefore, the hard mask layer 110 is removed but the conductive layer 120 is left.

The performance of pattern transferring is affected by the well preserved profile of the conductive layer. Because the conductive layer 120 has a high etching selectivity, the profile of the conductive layer 120 is well preserved. The underlying layers (such as target layer 104) below the conductive layer 120 are well protected. Therefore, the profile of the conductive layer 120 is well transferred to the underlying layer (such as target layer 104).

Figure 2E:
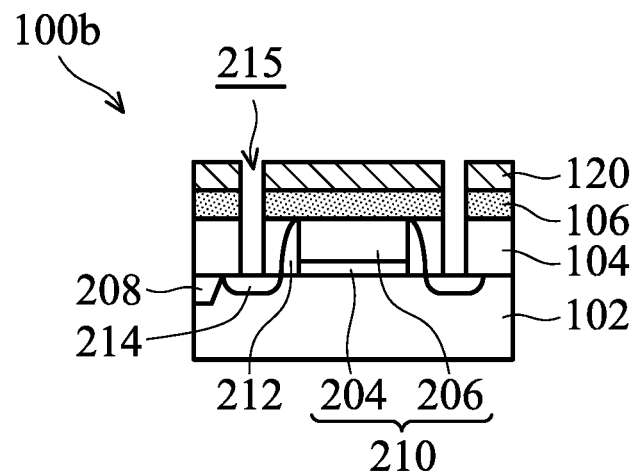

Afterwards, a portion of the seed layer 106 and a portion of the target layer 104 are removed, as shown in FIG. 2E, in accordance with some embodiments of the disclosure. The portion of the seed layer 106 and the portion of the target layer 104 are removed by using the conductive layer 120 as a mask. Therefore, the target layer 104 is patterned to form a trench 215.

Figure 2F:
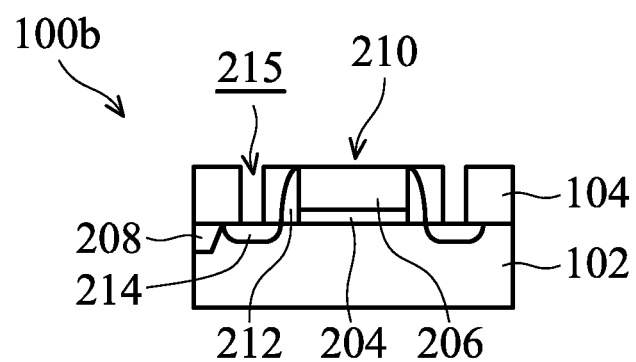

Afterwards, the conductive layer 120 and the seed layer 106 are removed, as shown in FIG. 2F, in accordance with some embodiments of the disclosure. The top surface of the S/D structure 214 is exposed by the trench 215.

Figure 2G:
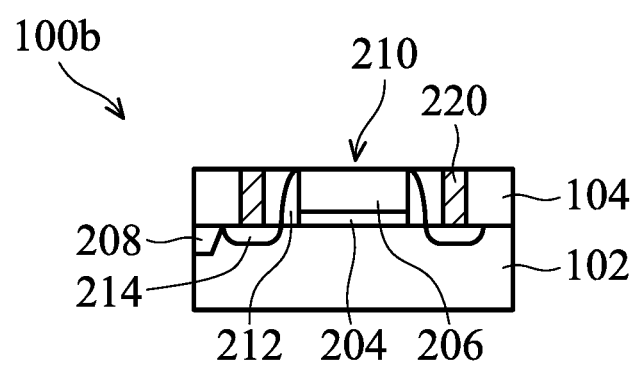

Afterwards, a conductive material is filled into the trench 215 and over the target layer 104, as shown in FIG. 2G, in accordance with some embodiments of the disclosure. Afterwards, a polishing process is performed to remove the conductive material out of the trench 215. Therefore, a contact structure 220 is formed and is electrically connected to the S/D structure 214.

FIGS. 3A-3G show cross-sectional representations of various stages of forming a semiconductor device structure 100c, in accordance with some embodiments of the disclosure. The semiconductor device structure 100c is similar to, or the same as, the semiconductor device structure 100b shown in FIG. 2G, except that an interconnect structure 360 (shown in FIG. 3G) is formed over the gate structure. Processes and materials used to form semiconductor device structure 100c may be similar to, or the same as, those used to form the semiconductor device structure 100b and are not repeated herein.

Figure 3A:
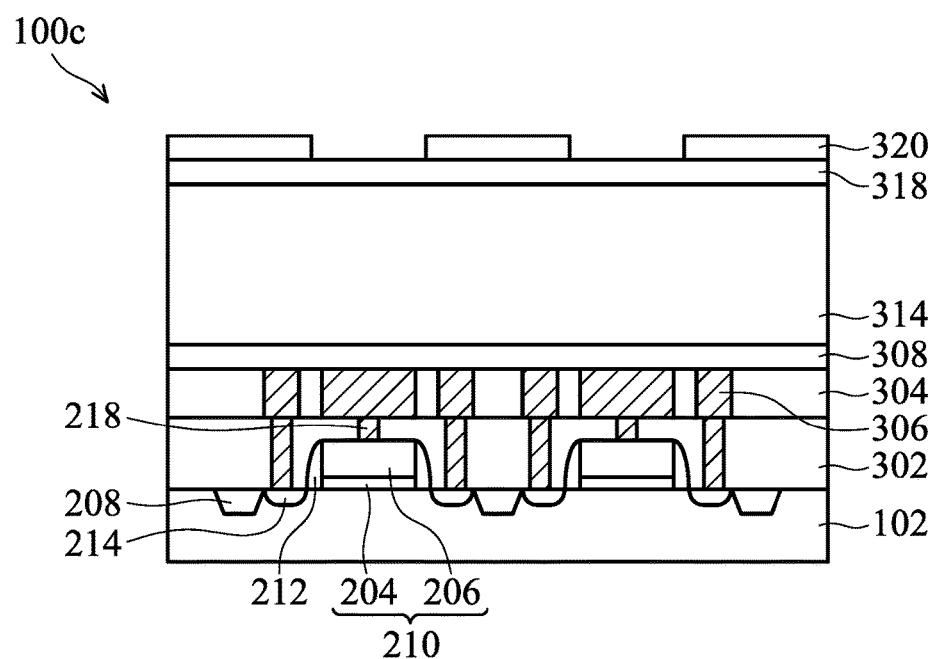
FIGS. 3A-3G show cross-sectional representations of various stages of forming a semiconductor device structure, in accordance with some embodiments of the disclosure.

Referring to FIG. 3A, a first dielectric layer 302 is formed over the substrate 102. The gate structure 210 including the gate dielectric layer 204 and the gate electrode layer 206 is formed in the first dielectric layer 302. The isolation structure 208 is formed in the substrate 102 to isolate two adjacent gate structures 210. The spacers 212 are formed on the opposite sidewalls of the gate structure 210. The S/D structures 214 are formed in the substrate 102 and adjacent to the spacers 212.

A first conductive layer 218 is formed in the first dielectric layer 302 and over the gate structure 110. In some embodiments, the first conductive layer 218 is made of copper (Cu), copper alloy, aluminum (Al), aluminum alloy, tungsten (W), tungsten alloy, titanium (Ti), titanium alloy, tantalum (Ta) or tantalum alloy. In some embodiments, first conductive layer 218 is formed by a plating method.

A second dielectric layer 304 is formed over the first dielectric layer 302. The second dielectric layer 304 is made of silicon oxide (SiOx), silicon nitride (SixNy), silicon oxynitride (SiON), or dielectric material(s) with low dielectric constant (low-k). In some embodiments, the second dielectric layer 304 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

A second conductive layer 306 is formed in the second dielectric layer 304. The second conductive layer 306 is electrically connected to the first conductive layer 218. In some embodiments, the second conductive layer 306 is made of copper (Cu), copper alloy, aluminum (Al), aluminum alloy, tungsten (W), tungsten alloy, titanium (Ti), titanium alloy, tantalum (Ta) or tantalum alloy.

A first etch stop layer 308 is formed over the second dielectric layer 304. The first etch stop layer 308 may be a single layer or multiple layers. The first etch stop layer 308 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the first etch stop layer 308 has a bi-layer structure which includes a silicon oxide (SiOx) layer formed on a SiC layer, and silicon oxide layer is formed from tetraethyl orthosilicate (TEOS). The SiC layer is used as a glue layer to improve adhesion between the underlying layer and silicon oxide layer.

The third dielectric layer 314 is formed on first etch stop layer 308. The third dielectric layer 314 may be a single layer or multiple layers. The third dielectric layer 314 is made of silicon oxide (SiOx), silicon nitride (SixNy), silicon oxynitride (SiON), or dielectric material(s) with low dielectric constant (low-k).

A second etch stop layer 318 and a hard mask layer 320 are sequentially formed on the third dielectric layer 314. The hard mask layer 320 is then patterned to form the patterned hard mask layer 320.

Figure 3B:
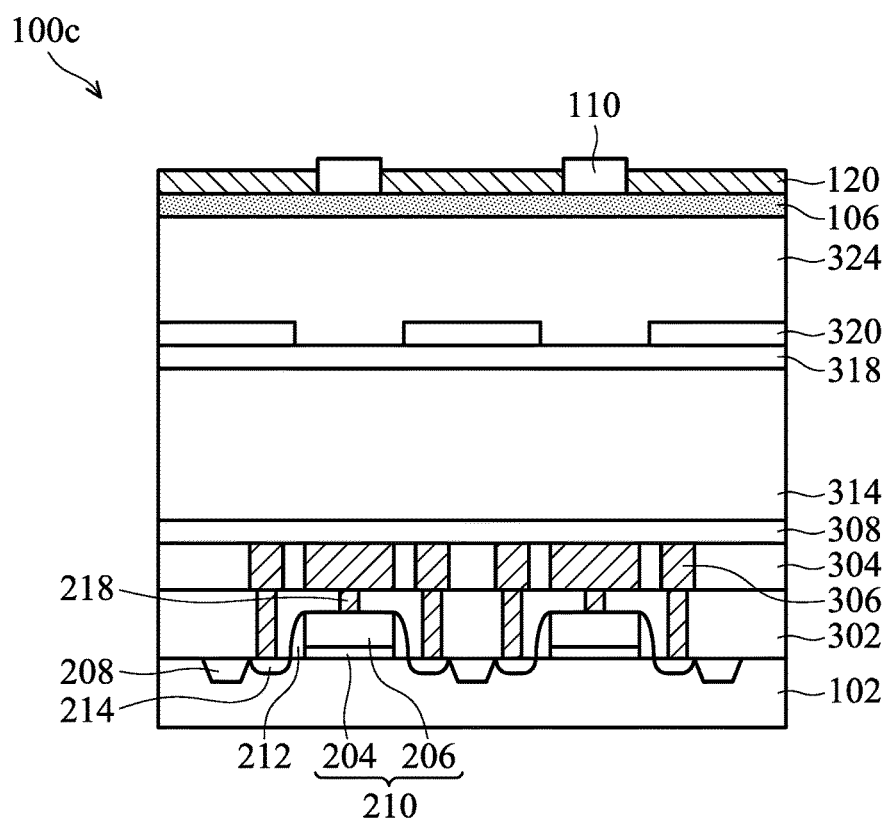

Afterwards, a fourth dielectric layer 324 is formed over the second etch stop layer 318 and the hard mask layer 320, as shown in FIG. 3B, in accordance with some embodiments of the disclosure. Next, the seed layer 106 is formed over the fourth dielectric layer 324, and the hard mask layer 110 is formed over the seed layer 106. The hard mask layer 110 is patterned to form the opening (not shown) and then the conductive layer 120 is formed in opening. As mentioned above, the conductive layer 120 is selectively formed on the seed layer 106.

Figure 3C:
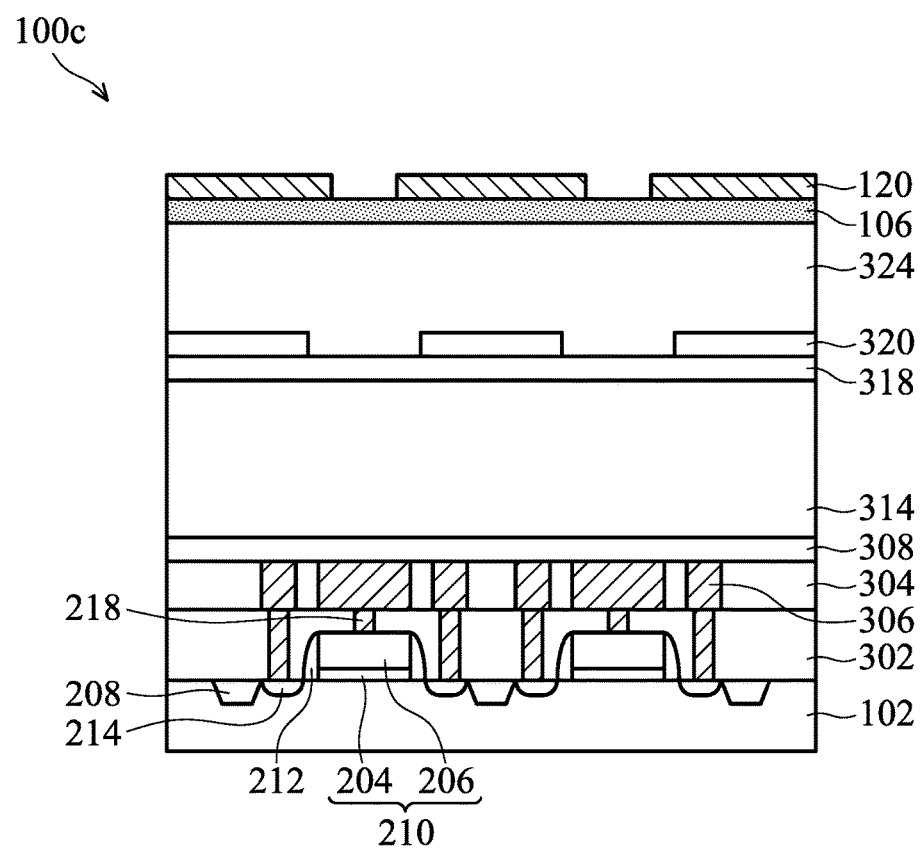

Afterwards, the hard mask layer 110 is removed, as shown in FIG. 3C, in accordance with some embodiments of the disclosure. Due to the conductive layer 120 has a high etching selectivity in relation to the hard mask layer 110, the conductive layer 120 is left while the hard mask layer 110 is removed.

Figure 3D:
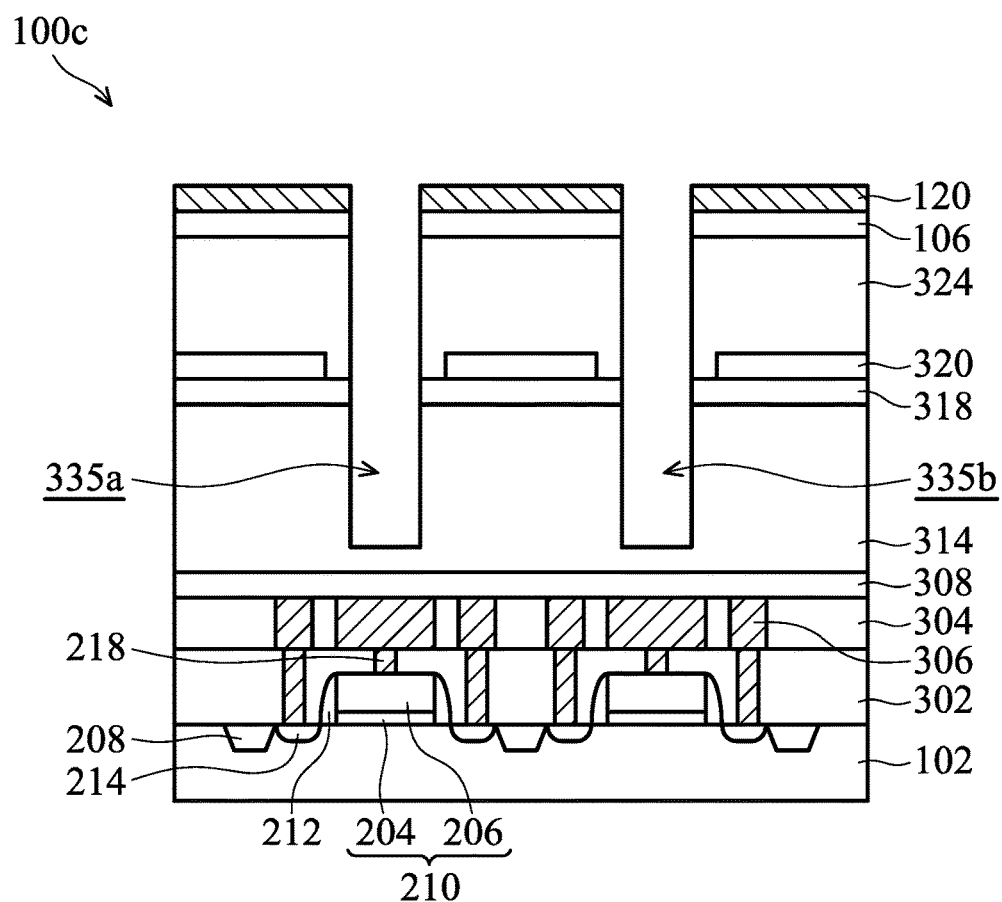

Afterwards, the seed layer 106, the fourth dielectric layer 324, the second etch stop layer 318 and the third dielectric layer 314 are sequentially removed, as shown in FIG. 3D, in accordance with some embodiments of the disclosure. Therefore, a first hole 335a and a second hole 335b are formed in the third dielectric layer 314. In some embodiments, the seed layer 106, the fourth dielectric layer 324, the second etch stop layer 318 and the third dielectric layer 314 are sequentially removed by a multiple etching processes.

Figure 3E:
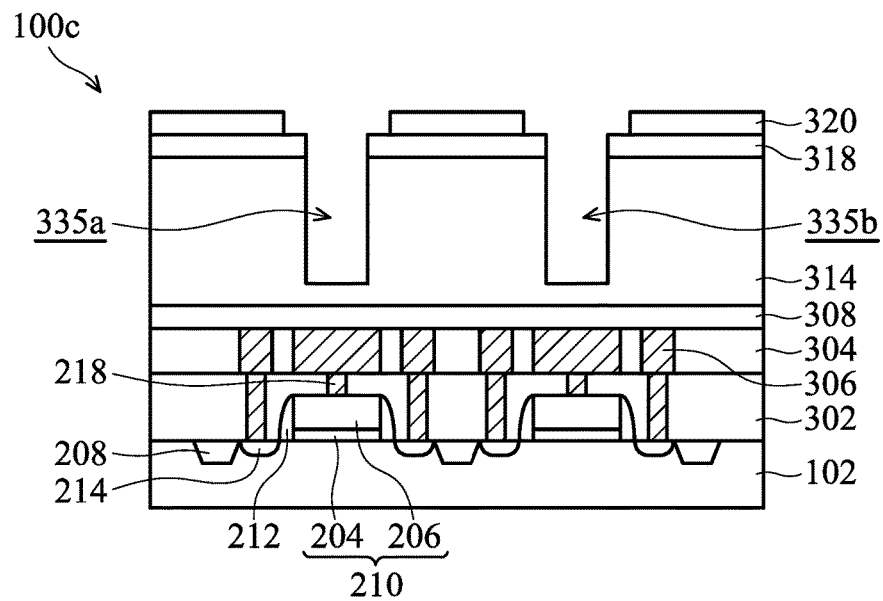

Afterwards, the conductive layer 120, the seed layer 106 and the fourth dielectric layer 324 are sequentially removed, as shown in FIG. 3E, in accordance with some embodiments of the disclosure.

Figure 3F:
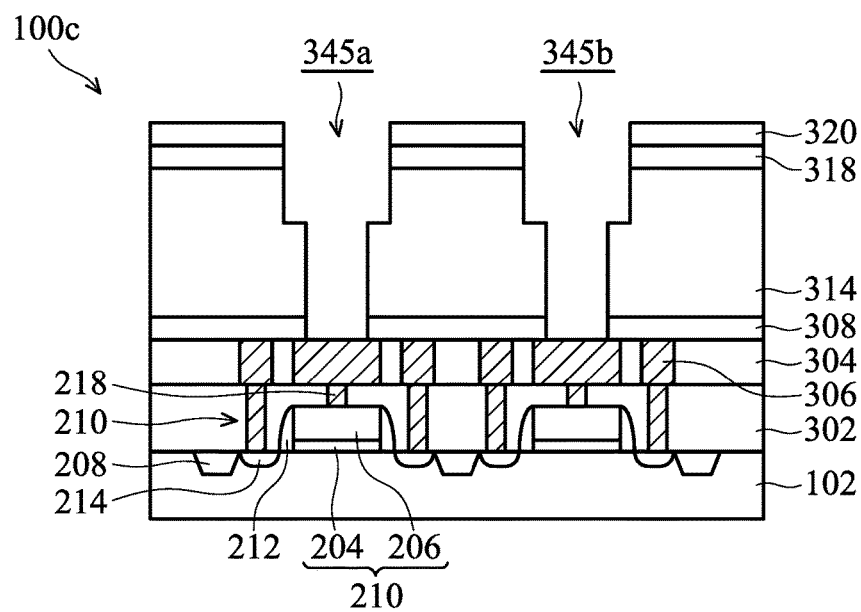

Afterwards, a portion of the second etch stop layer 318 and a portion of the third dielectric layer 314 are sequentially removed by using the hard mask layer 320 as a mask, as shown in FIG. 3F, in accordance with some embodiments of the disclosure. As a result, a first trench-via structure 345a and a second trench-via structure 345b are formed in the third dielectric layer 314 to use as dual damascene cavities.

Figure 3G:
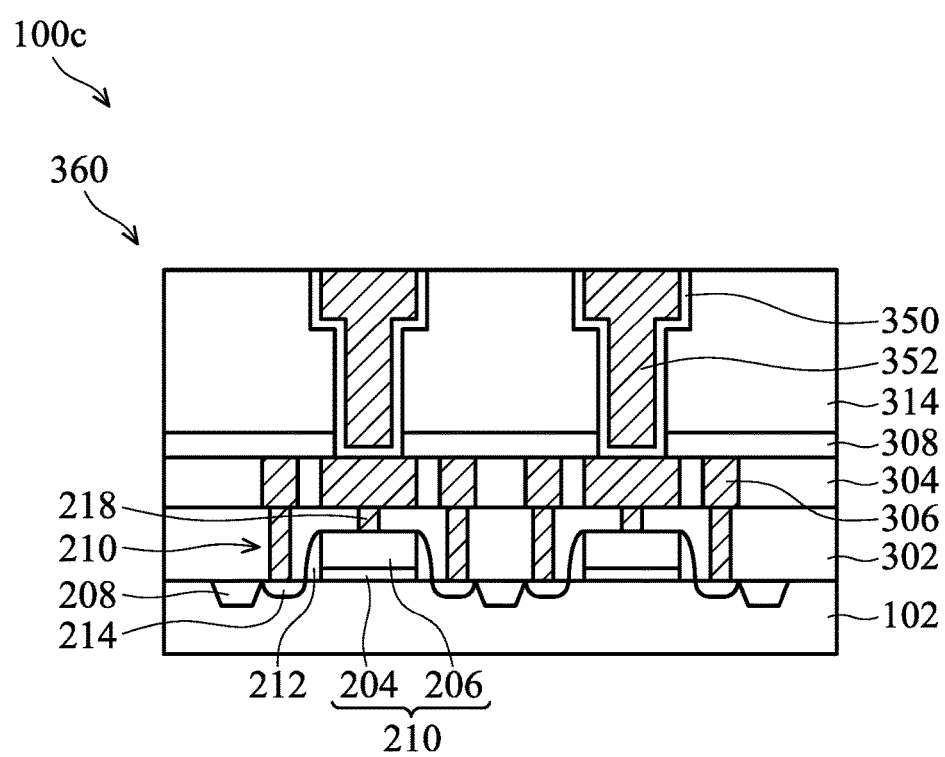

Afterwards, the a diffusion barrier layer 350 is formed in first trench-via structure 345a and the second trench-via structure 345b, and a third conductive structure 352 is formed on the diffusion barrier layer 350, as shown in FIG. 3G, in accordance with some embodiments of the disclosure. An interconnect structure 360 is formed over the first dielectric layer 302. The interconnect structure 360 is formed by the second dielectric layer 304, the second conductive layer 306, the third dielectric layer 314 and the third conductive structure 352.

The diffusion barrier layer 350 may be made of titanium (Ti), titanium nitride (TiN), tantalum (Ta), tantalum nitride (TaN), or aluminum nitride (AlN). In some embodiments, the third conductive structure 352 is made of copper, and the diffusion barrier layer 350 includes TaN/Ta bi-layer.

FIGS. 4A-4H show cross-sectional representations of various stages of forming a semiconductor device structure 100d, in accordance with some embodiments of the disclosure. The semiconductor device structure 100d is similar to, or the same as, the semiconductor device structure 100a shown in FIG. 1F, except that a 3D fin structure 410 (shown in FIG. 4F) is extended from above the substrate 102. Processes and materials used to form semiconductor device structure 100d may be similar to, or the same as, those used to form the semiconductor device structure 100a and are not repeated herein.

Figure 4A:
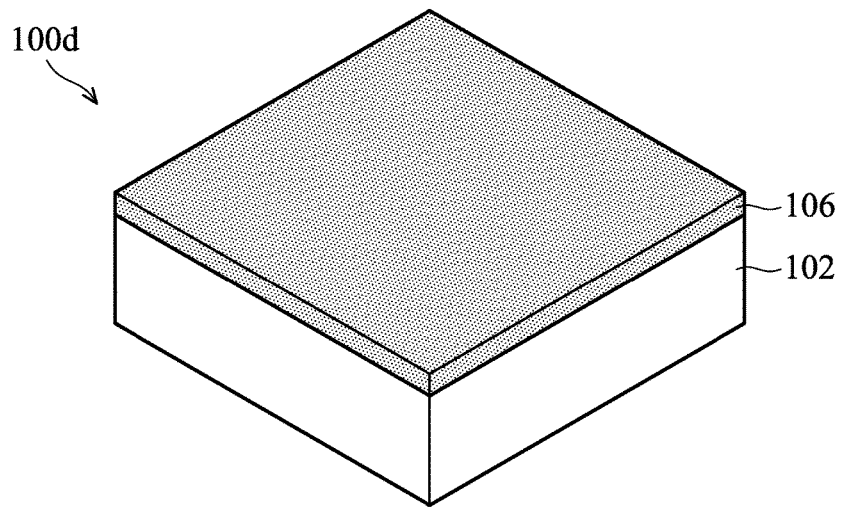
FIGS. 4A-4H show cross-sectional representations of various stages of forming a semiconductor device structure, in accordance with some embodiments of the disclosure.

Referring to FIG. 4A, the substrate 102 is provided, and the seed layer 106 is formed over the substrate 102. In some embodiments, the substrate 102 is a silicon wafer.

Figure 4B:
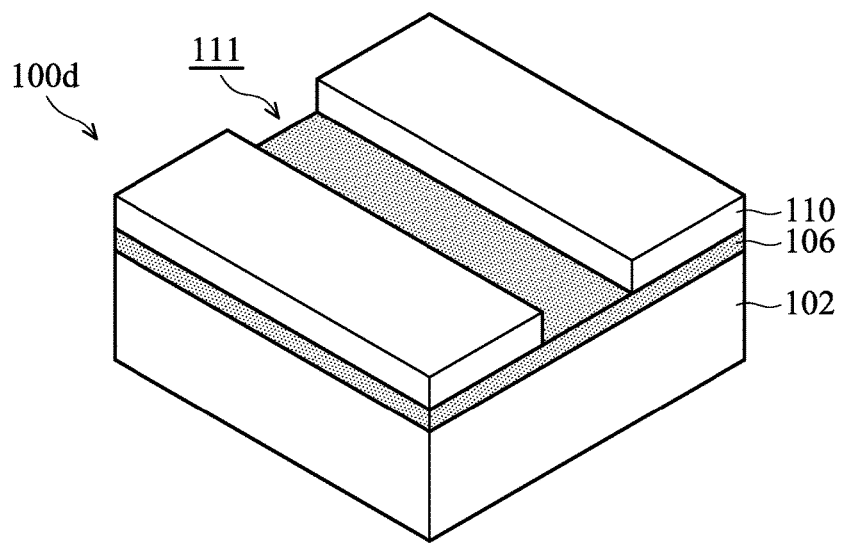

Afterwards, the hard mask layer 110 is formed over the seed layer 106. Next, the hard mask layer 110 is patterned to form the opening 111, as shown in FIG. 4B, in accordance with some embodiments of the disclosure. The top surface of the seed layer 106 is exposed by the opening 111.

Figure 4C:
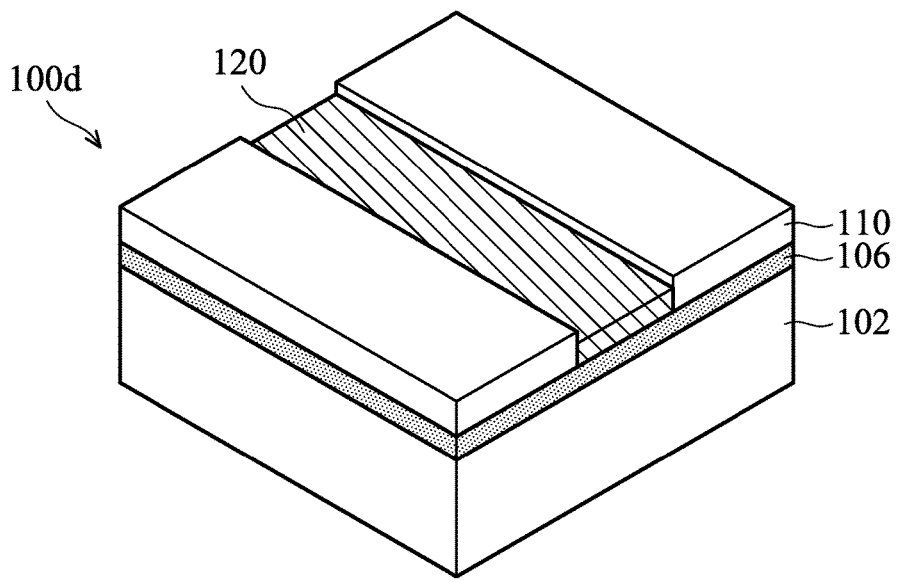

Afterwards, the conductive layer 120 is formed in the opening 111, as shown in FIG. 4C, in accordance with some embodiments of the disclosure. The top surface of the conductive layer 120 is level with or lower than the top surface of the hard mask layer 110. In some embodiments, the conductive layer 120 is formed by a selective deposition process, such as a selective CVD process or a selective electroless plating process. The conductive layer 120 is selectively formed on the seed layer 106, but not formed on the hard mask layer 110.

Figure 4D:
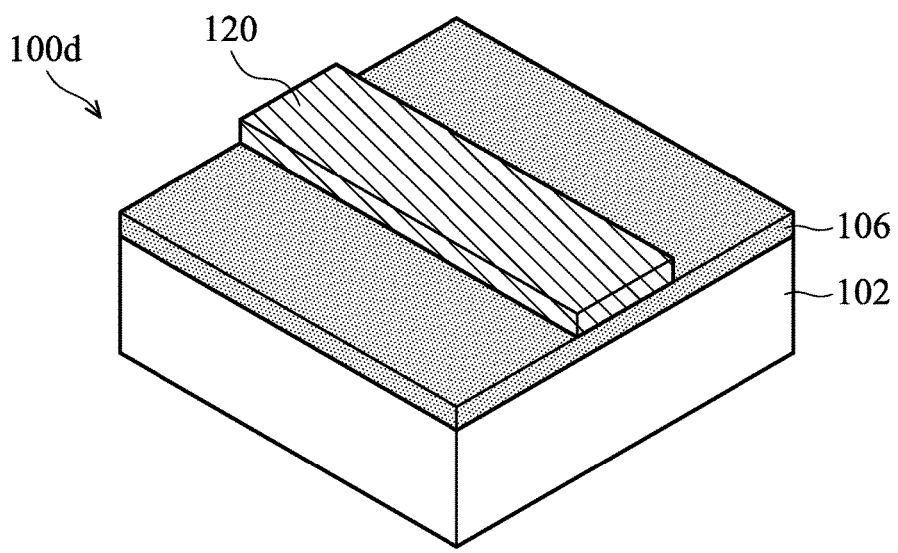

Afterwards, the hard mask layer 110 is removed to expose a portion of the seed layer 106, as shown in FIG. 4D, in accordance with some embodiments of the disclosure. The conductive layer 120 has a high etching selectivity in relation to the hard mask layer 110. The etching rate of the hard mask layer 110 is higher than that of the conductive layer 120.

Figure 4E:
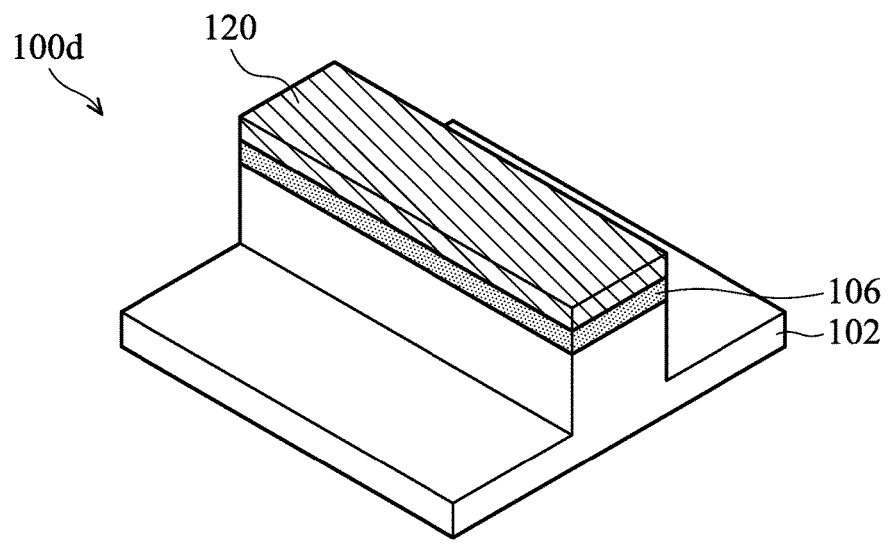

Afterwards, a portion of the seed layer 106 and a portion of the substrate 102 are removed by using the conductive layer 120 as a mask, as shown in FIG. 4E, in accordance with some embodiments of the disclosure.

Figure 4F:
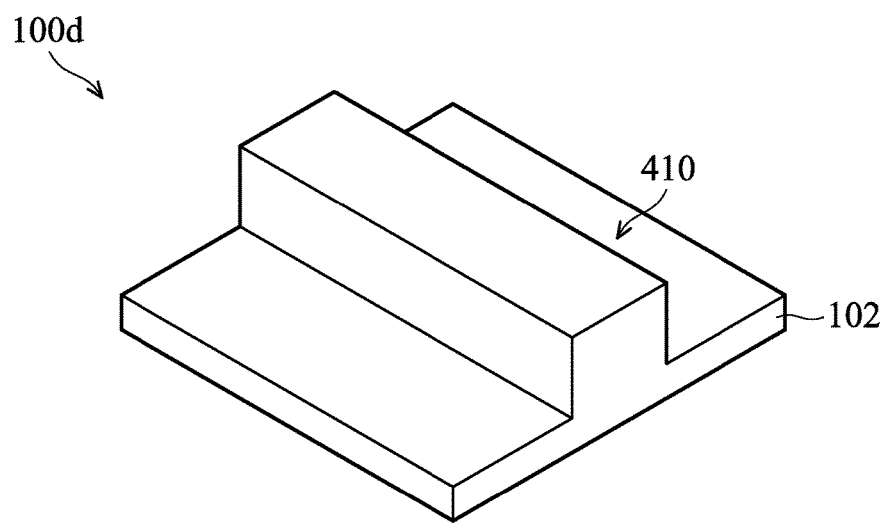

Afterwards, the conductive layer 120 and remaining seed layer 106 below the conductive layer 120 are removed, as shown in FIG. 4F, in accordance with some embodiments of the disclosure. As a result, a fin structure 410 is obtained. The fin structure 410 is extended above from the substrate 102.

Figure 4G:
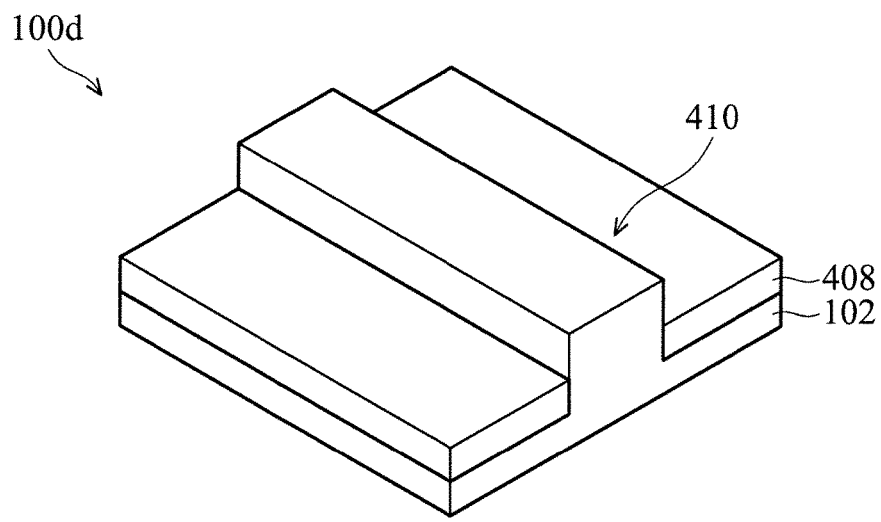

Afterwards, an isolation structure 408 is formed over the substrate 102, as shown in FIG. 4G, in accordance with some embodiments of the disclosure. The bottom portion of the fin structure 410 is embedded in the isolation structure 408.

Figure 4H:
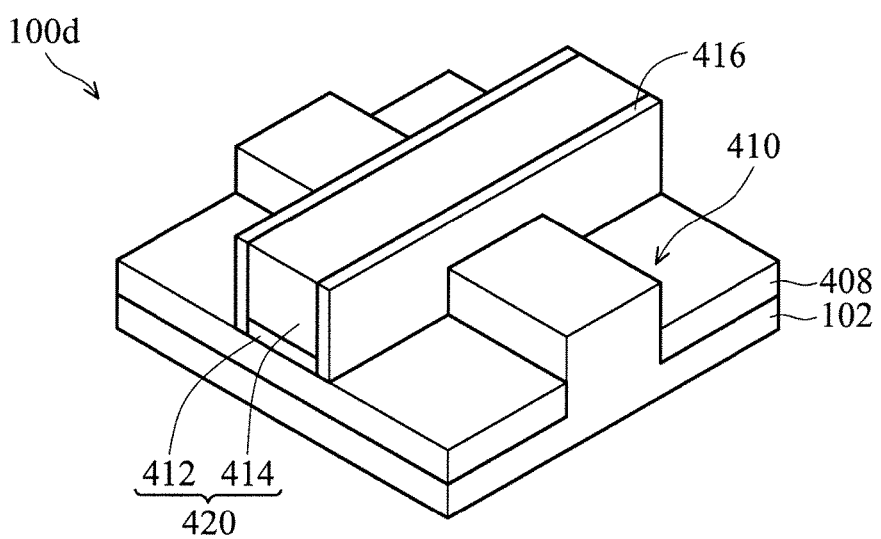

Afterwards, a gate structure 420 is formed over a middle portion of the fin structure 410, as shown in FIG. 4H, in accordance with some embodiments of the disclosure. The gate structure 420 includes a gate dielectric layer 412 and a gate electrode layer 414. Spacers 416 are formed on opposite sidewalls of the gate structure 420. The gate structure 420 traverses the fin structure 410.

As mentioned above, the conductive layer 120 is selectively formed in the specific region, such as the exposed surface of the seed layer 106. The conductive layer 120 is formed by selective deposition process, for example, selective CVD process or selective electroless plating process. Since the conductive layer 120 is self-aligned, no conductive layer is formed over the hard mask layer 110. Therefore, no removal operation is performed between deposition process of the conductive layer and removing process of the hard mask layer. Furthermore, the voids may not be formed in the conductive layer 120.

Embodiments for forming a semiconductor device structure and method for formation of the same are provided. A target layer is formed over a substrate, and a seed layer is formed over the target layer. A hard mask layer is formed over the seed layer and is patterned to form an opening. A conductive layer is selectively formed in the opening. The target layer is patterned by using a conductive layer as a mask. The conductive layer is selectively formed on the seed layer by a selective deposition process. The conductive layer is self-aligned, and no extra removing process is needed to remove the excess metal material. Therefore, the fabrication process and time for forming the semiconductor device structure are reduced.

In some embodiments, a method for forming a semiconductor device structure is provided. The method includes forming a target layer over a substrate and forming a seed layer over the target layer. The method includes forming a hard mask layer over the seed layer, and the hard mask layer includes an opening to expose a portion of the seed layer. The method includes forming a conductive layer in the opening, and the conductive layer is selectively formed on the portion of the seed layer. The method includes etching a portion of the target layer by using the conductive layer as a mask.

In some embodiments, a method for forming a semiconductor device structure is provided. The method includes forming a gate structure over a substrate and forming a source/drain (S/D) structure in the substrate and adjacent to the gate structure. The method includes forming a first dielectric layer over the gate structure and forming a seed layer over the dielectric layer. The method include forming a first hard mask layer over the seed layer, and the first hard mask layer has a plurality of openings. The method includes forming a conductive layer in the openings and removing the patterned first hard mask layer. The method includes removing a portion of the first dielectric layer by using the conductive layer as a mask to form a trench in the dielectric layer.

In some embodiments, a method for forming a semiconductor device structure is provided. The method includes forming a seed layer over a substrate. The method includes forming a hard mask layer over the seed layer, and the hard mask layer has an opening. The method includes forming a conductive layer in the opening, and the conductive layer is not formed over the hard mask layer. The method includes etching a portion of the substrate by using the conductive layer as a mask to form a fin structure, and the fin structure is extended above the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
forming a gate structure over a substrate;
forming a source/drain (S/D) structure in the substrate and adjacent to the gate structure;
forming a first dielectric layer over the gate structure;
forming a first seed layer over the first dielectric layer;
forming a patterned first hard mask layer over the first seed layer, wherein the patterned first hard mask layer has a plurality of first openings;
forming a temporary conductive layer in the first openings;
removing the patterned first hard mask layer;
removing a portion of the first dielectric layer by using the temporary conductive layer as a mask to form a trench in the first dielectric layer;
forming a contact structure in the trench, wherein the contact structure is electrically connected to the S/D structure;
forming a second dielectric layer over the first dielectric layer;
forming an etch stop layer over the second dielectric layer;
forming a third dielectric layer over the etch stop layer;
forming a second seed layer over the third dielectric layer;

forming a patterned second hard mask layer over the second seed layer, wherein the patterned second hard mask layer has a plurality of second openings;

forming a metal layer in the second openings; and etching a portion of the third dielectric layer by using the metal layer as a mask.

2. The method for forming the semiconductor device structure as claimed in claim 1, after removing the portion of the first dielectric layer, further comprising:

removing the temporary conductive layer; and removing the first seed layer which is below the temporary conductive layer.

3. The method for forming the semiconductor device structure as claimed in claim 1, wherein forming the temporary conductive layer in the openings comprises:

using a selective deposition process to deposit the temporary conductive layer on an exposed surface of the first seed layer which is exposed by the opening, wherein the selective deposition process comprises a selective chemical vapor deposition (CVD) process or a selective electroless plating process.

4. The method for forming the semiconductor device structure as claimed in claim 1, wherein a top surface of the temporary conductive layer is equal to or lower than a top surface of the patterned first hard mask layer.

5. The method for forming the semiconductor device structure as claimed in claim 1, before forming the etch stop layer over the second dielectric layer, further comprising:

forming a first conductive layer in the second dielectric layer, wherein the first conductive layer is electrically connected to the gate structure.

6. The method for forming the semiconductor device structure as claimed in claim 5, after etching the portion of the third dielectric layer, further comprising:

forming a second conductive layer in the third dielectric layer, wherein the second conductive layer is electrically connected to the first conductive layer.

7. A method for forming a semiconductor device structure, comprising:

forming a gate structure over a substrate;

forming a source/drain (S/D) structure in the substrate and adjacent to the gate structure;

forming a first dielectric layer over the gate structure;

forming a first seed layer over the first dielectric layer;

forming a patterned first hard mask layer over the first seed layer, wherein the patterned first hard mask layer comprises a first opening to form an exposed surface of the first seed layer;

forming a temporary conductive layer in the first opening, wherein the temporary conductive layer is selectively formed on the exposed surface of the first seed layer;

etching a portion of the first dielectric layer by using the temporary conductive layer as a mask to form a trench in the first dielectric layer;

forming a contact structure in the trench, wherein the contact structure is electrically connected to the S/D structure;

forming a second dielectric layer over the first dielectric layer;

forming a second seed layer over the second dielectric layer;

forming a patterned second hard mask layer over the second seed layer, wherein the patterned second hard mask layer has a second opening;

forming a metal layer in the second opening; and etching a portion of the second dielectric layer by using the metal layer as a mask.

8. The method for forming the semiconductor device structure as claimed in claim 7, wherein the step of forming the temporary conductive layer in the first opening comprises:

using a selective deposition process to deposit the temporary conductive layer on the exposed surface of the first seed layer, wherein the selective deposition process comprises a selective chemical vapor deposition (CVD) process or a selective electroless plating process.

9. The method for forming the semiconductor device structure as claimed in claim 8, wherein when the selective chemical vapor deposition (CVD) process is performed, tungsten hexa-fluoride ($WF_6$) is used as a precursor gas.

10. The method for forming the semiconductor device structure as claimed in claim 7, wherein the temporary conductive layer is not formed on the patterned first hard mask layer when the step of forming the temporary conductive layer in the first opening is performed.

11. The method for forming the semiconductor device structure as claimed in claim 7, wherein no removal process is performed between the step of forming the temporary conductive layer in the first opening and the step of etching the portion of the first dielectric layer.

12. The method for forming the semiconductor device structure as claimed in claim 7, further comprising:

removing the temporary conductive layer after the step of removing the portion of the first dielectric layer; and removing the seed layer which is below the temporary conductive layer.

13. A method for forming a semiconductor device structure, comprising:

forming a gate structure over a substrate;

forming a first dielectric layer over the gate structure;

forming a second dielectric layer over the first dielectric layer;

forming a first etch stop layer over the second dielectric layer;

forming a third dielectric layer over the first etch stop layer;

forming a fourth dielectric layer over the third dielectric layer;

forming a seed layer over the fourth dielectric layer;

forming a patterned hard mask layer over the seed layer, wherein the patterned hard mask layer comprises an opening to form an exposed surface of the seed layer;

depositing a temporary conductive layer on the exposed surface of the seed layer; and etching a portion of the fourth dielectric layer and a portion of the third dielectric layer by using the temporary conductive layer as a mask.

14. The method for forming the semiconductor device structure as claimed in claim 13, further comprising:

forming a trench-via structure in the third dielectric layer after the step of etching the portion of the fourth dielectric layer and the portion of the third dielectric layer, wherein the trench-via structure has a wide top portion and a narrow bottom portion;

forming a diffusion barrier layer in the trench-via structure; and forming a conductive structure on the diffusion barrier layer.

15. The method for forming the semiconductor device structure as claimed in claim 13, wherein the temporary conductive layer is not formed on the patterned hard mask layer when the step of depositing the temporary conductive layer on the exposed surface of the seed layer is performed.

16. The method for forming the semiconductor device structure as claimed in claim 13, wherein no removal process is performed between the step of depositing the temporary conductive layer on the exposed surface of the seed layer and the step of etching the portion of the fourth dielectric layer.

17. The method for forming the semiconductor device structure as claimed in claim 3, wherein when the selective chemical vapor deposition (CVD) process is performed, tungsten hexa-fluoride ($WF_6$) is used as a precursor gas.

18. The method for forming the semiconductor device structure as claimed in claim 13, wherein a top surface of the temporary conductive layer is equal to or lower than a top surface of the patterned first hard mask layer.

* * * * *